United States Patent
Sperl et al.

(10) Patent No.: US 10,324,154 B2
(45) Date of Patent: Jun. 18, 2019

(54) GENERALIZED SPHERICAL DECONVOLUTION IN DIFFUSION MAGNETIC RESONANCE IMAGING

(71) Applicant: General Electric Company, Schenectady, NY (US)

(72) Inventors: Jonathan Immanuel Sperl, Freising (DE); Christopher Judson Hardy, Niskayuna, NY (US); Luca Marinelli, Niskayuna, NY (US); Marion Irene Menzel, Munich (DE); Ek Tsoon Tan, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 1071 days.

(21) Appl. No.: 14/711,650

(22) Filed: May 13, 2015

(65) Prior Publication Data

US 2016/0334489 A1 Nov. 17, 2016

(51) Int. Cl.
*G01R 33/56* (2006.01)
*G01R 33/563* (2006.01)

(52) U.S. Cl.
CPC ... *G01R 33/56341* (2013.01); *G01R 33/5608* (2013.01)

(58) Field of Classification Search
CPC .......... G01R 33/56341; G01R 33/5608; G01R 33/4806
See application file for complete search history.

(56) References Cited

U.S. PATENT DOCUMENTS 6,614,226 B2  9/2003  Wedeen
6,992,484 B2  1/2006  Frank
7,034,531 B1  4/2006  Tuch et al.
7,078,897 B2  7/2006  Yablonskiy et al.
7,495,440 B2  2/2009  Chiang et al.
7,511,494 B2  3/2009  Wedeen
7,643,863 B2  1/2010  Basser et al.
(Continued)

FOREIGN PATENT DOCUMENTS

CN   103279633 A   9/2013
CN   103280144 A   9/2013
(Continued)

OTHER PUBLICATIONS

Janke, Andrew, et al.; "Use of Spherical Harmonic Deconvolution Methods to Compensate for Nonlinear Gradient Effects on MRI Images," Magnetic Resonance in Medicine, 2004, pp. 115-122, vol. 52.

(Continued)

*Primary Examiner* — Giovanni Astacio-Oquendo
*Assistant Examiner* — Alvaro E Fortich

(57) ABSTRACT

A magnetic resonance imaging method includes generating spatially resolved fiber orientation distributions (FODs) from magnetic resonance signals acquired from a patient tissue using a plurality of diffusion encodings, each acquired magnetic resonance signal corresponding to one of the diffusion encodings and being representative of a three-dimensional distribution of displacement of magnetic spins of gyromagnetic nuclei present in each imaging voxel. Generating the spatially resolved FODs includes performing generalized spherical deconvolution using the acquired magnetic resonance signals and a modeled tissue response matrix (TRM) to reconstruct the spatially resolved FODs. The method also includes using the spatially resolved FODs to generate a representation of fibrous tissue within the patient tissue.

20 Claims, 8 Drawing Sheets

(56) References Cited

U.S. PATENT DOCUMENTS

| | | | |
|---|---|---|---|
| 7,711,171 | B2 | 5/2010 | Basser et al. |
| 7,881,878 | B2 | 2/2011 | Burrus et al. |
| 8,170,305 | B2 | 5/2012 | Laidlaw et al. |
| 8,380,280 | B2 | 2/2013 | Basser et al. |
| 8,704,515 | B2 | 4/2014 | Ozarslan et al. |
| 2002/0042569 | A1 | 4/2002 | Wedeen |
| 2005/0024051 | A1 | 2/2005 | Doddrell et al. |
| 2010/0004527 | A1 | 1/2010 | Dale et al. |
| 2010/0308821 | A1 | 12/2010 | Poupon et al. |
| 2012/0002851 | A1 | 1/2012 | Jensen et al. |
| 2012/0249136 | A1 | 10/2012 | Marinelli et al. |
| 2012/0262172 | A1* | 10/2012 | Holmes .............. G01R 33/5602 324/309 |
| 2012/0268459 | A1 | 10/2012 | Leemans |
| 2012/0280686 | A1* | 11/2012 | White .............. G01R 33/56341 324/309 |
| 2013/0004049 | A1 | 1/2013 | Weeden |
| 2013/0009959 | A1* | 1/2013 | Calamante ....... G01R 33/56341 345/428 |
| 2014/0077813 | A1* | 3/2014 | Holmes .............. G01R 33/4824 324/322 |
| 2014/0167753 | A1* | 6/2014 | Sperl ................ G01R 33/56341 324/309 |
| 2014/0210474 | A1* | 7/2014 | Haldar ............. G01R 33/56341 324/318 |
| 2014/0294270 | A1 | 10/2014 | Schneider et al. |
| 2015/0119697 | A1 | 4/2015 | Penn |

FOREIGN PATENT DOCUMENTS

| | | |
|---|---|---|
| CN | 104599244 A | 5/2015 |
| WO | 0138895 A1 | 5/2001 |
| WO | 0191639 A1 | 12/2001 |
| WO | 2011018155 A1 | 2/2011 |
| WO | 2013192624 A1 | 12/2013 |

OTHER PUBLICATIONS

Tournier, J. Donald, et al.; "Direct estimation of the fiber orientation density function from diffusion-weighted MRI data using spherical deconvolution," NeuroImage, 2004, pp. 1176-1185, vol. 23.

Kaden, Enrico, et al.; "Parametric spherical deconvolution: Inferring anatomical connectivity using diffusion MR imaging," NeuroImage, 2007, pp. 474-488, vol. 37.

Tournier, J. Donald, et al.; Robust determination of the fibre orientation distribution in diffusion MRI: Non-negativity constrained super-resolved spherical deconvolution, NeuroImage, 2007, pp. 1459-1472, vol. 35.

Dell'Acqua, Flavio, et al.; "A modified damped Richardson-Lucy algorithm to reduce isotropic background effects in spherical deconvolution," NeuroImage, 2010, pp. 1446-1458, vol. 49.

Patel, Vishal, et al.; "Mesh-based spherical deconvolution: A flexible approach to reconstruction of non-negative fiber orientation distributions," NeuroImage, Jul. 1, 2010, pp. 1071-1081, vol. 51.

Menzel, Marion I., et al.; "Accelerated Diffusion Spectrum Imaging in the Human Brain Using Compressed Sensing," Magnetic Resonance in Medicine, 2011, pp. 1226-1233, vol. 66.

Yang, Junfeng, et al.; "Alternating Direction Algorithms for_ Problems in Compressive Sensing"; SIAM J. Sci, vol. 33, No. 1, pp. 250-278; 2011.

Jeurissen, Ben, et al.; "Multi-tissue constrained spherical deconvolution for improved analysis of multi-shell diffusion MRI data," NeuroImage, 2014, pp. 411-426, vol. 103.

Tan, Ek T., et al.; Robust Automated Tractography of the Brain Using Diffusion Spectrum Imaging, Computer #41, Program 4524, ISMRM 2014, pp. 1-13.

Yeh, Fang-Cheng, et al.; "Increasing the Analytical Accessibility of Multishell and Diffusion Spectrum Imaging Data Using Generalized Q-Sampling Conversion," Department of Psychology and Center for the Neural Basis of Computation, Carnegie Mellon University, Sep. 9, 2014; pp. 1-39.

Sperl, Jonathan I., et al.; "Total-Variation-Regularized Compressed Sensing Reconstruction for Multi-Shell Diffusion Kurtosis Imaging," http://www.ncbi.nlm.nih.gov/pmc/articles/PMC2630711/.

Cheng, J., et al., "Non-Negative Spherical Deconvolution (NNSD) for estimation of fiber Orientation Distribution Function in single-/multi-shell diffusion MRI," NeuroImage, vol. 101, pp. 750-764 (2014).

First Office Action and Search issued in connection with corresponding CN Application No. 201610314555.2 dated Jul. 3, 2017.

* cited by examiner

GENERALIZED SPHERICAL DECONVOLUTION IN DIFFUSION MAGNETIC RESONANCE IMAGING

BACKGROUND

In general, magnetic resonance imaging (MRI) examinations are based on the interactions among a primary magnetic field, a radiofrequency (RF) magnetic field, and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

Techniques have been developed to perform MRI imaging sequences to generate diffusion information that might be indicative of tissue microstructure, and/or to evaluate tissue for various abnormalities, such as neural injuries, neural degenerative disorders, and so on. In diffusion imaging, information is encoded in both image space and diffusion space, the latter typically referred to in the art as q-space. Typically, q-space is utilized to detect the movement of hydrogen nuclei in water molecules. Diffusion encoding gradient pulses are utilized to characterize the three-dimensional movement of the water molecules within and between tissues—more specifically within individual voxels (each spatial location). The movement of the water molecules may be characterized as incoherent motion, which results from diffusion processes, and coherent motion, which results from tissue movement, such as during pulsation.

The data that is obtained from q-space acquisitions may be categorized into either diffusion spectrum imaging (DSI), single-shell acquisition (e.g., high-angular diffusion imaging (HARDI)), or multi-shell acquisitions, depending on the sampling technique. However, due to the high dimensionality of the acquisition techniques (e.g., 3D in spatial domain and 3D in q-space), evaluating the diffusion properties of water in vivo may result in extended scan times to acquire acceptable data for image reconstruction.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the invention. Indeed, the present disclosure may encompass a variety of forms that may be similar to or different from the embodiments set forth below.

In one embodiment, a magnetic resonance imaging method includes generating spatially resolved fiber orientation distributions (FODs) from magnetic resonance signals acquired from a patient tissue using a plurality of diffusion encodings, each acquired magnetic resonance signal corresponding to one of the diffusion encodings and being representative of a three-dimensional distribution of displacement of magnetic spins of gyromagnetic nuclei present in each imaging voxel. Generating the spatially resolved FODs includes performing generalized spherical deconvolution using the acquired magnetic resonance signals and a modeled tissue response matrix (TRM) to reconstruct the spatially resolved FODs. The method also includes using the spatially resolved FODs to generate a representation of fibrous tissue within the patient tissue.

In a second embodiment, a magnetic resonance imaging (MRI) system includes a primary field magnet that may place gyromagnetic nuclei within a patient into an equilibrium magnetization, a plurality of gradient field coils that may encode positional information into the gyromagnetic nuclei, a radiofrequency (RF) transmit coil that may perturb the gyromagnetic nuclei away from their equilibrium magnetization, a plurality of RF receiving coils configured to receive MR signals from the gyromagnetic nuclei as they relax to their equilibrium magnetization, and control and analysis circuitry programmed to acquire magnetic resonance signals using a plurality of diffusion encodings, each acquired magnetic resonance signal corresponding to one of the diffusion encodings and being representative of a three-dimensional distribution of displacement of magnetic spins of the gyromagnetic nuclei present in each imaging voxel, perform generalized spherical deconvolution using the acquired magnetic resonance signal and a modeled tissue response matrix (TRM) to reconstruct a spatially resolved fiber orientation distribution (FODs), and generate a representation of fibrous tissue within the patient using the spatially resolved FODs.

In a third embodiment, one or more tangible, non-transitory, machine-readable media storing instructions executable by one or more processors to cause a magnetic resonance (MR) imaging system to acquire magnetic resonance signals using a plurality of diffusion encodings, each acquired magnetic resonance signal corresponding to one of the diffusion encodings and being representative of a three-dimensional distribution of displacement of magnetic spins of the gyromagnetic nuclei present in each imaging voxel, perform generalized spherical deconvolution using the acquired magnetic resonance signal and a modeled tissue response matrix (TRM) to reconstruct a spatially resolved fiber orientation distribution (FODs); and generate a representation of fibrous tissue within the patient using the spatially resolved FODs.

BRIEF DESCRIPTION OF THE DRAWINGS

These and other features, aspects, and advantages of the present embodiments will become better understood when the following detailed description is read with reference to the accompanying drawings in which like characters represent like parts throughout the drawings, wherein.

DETAILED DESCRIPTION

Figure 1:
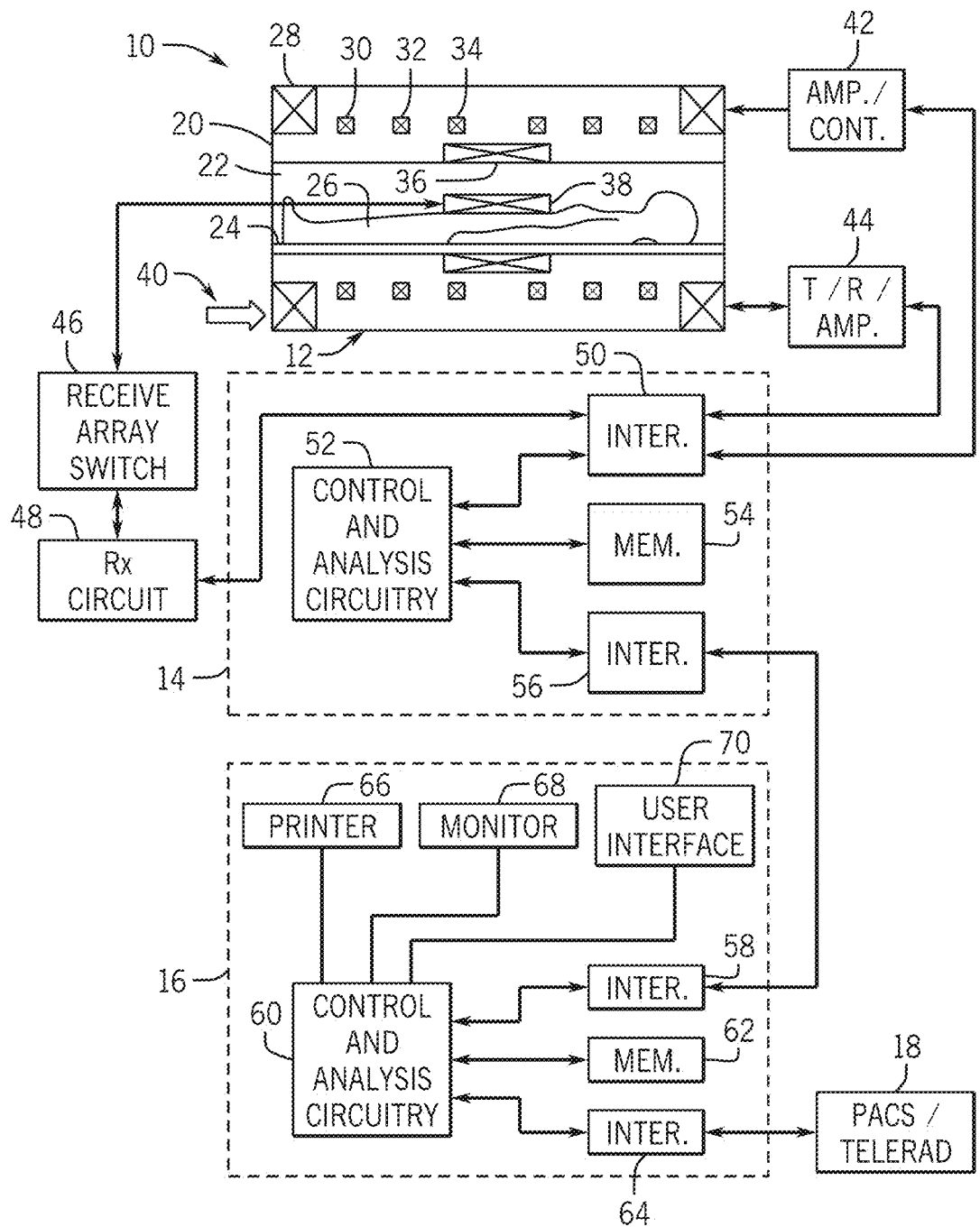
FIG. 1 is a diagrammatical illustration of an embodiment of a magnetic resonance imaging (MRI) system configured to perform diffusion imaging in accordance with an aspect of the present disclosure.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present embodiments, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Diffusion MRI (dMRI) may be used to evaluate white matter pathways in a patient's brain (e.g., via fiber tracking also known as tractography) and to generate quantitative tissue maps (e.g., mean diffusivity (MD), fractional anisotropy (FA), mean kurtosis, radial kurtosis, and/or neurite dispersion NODDI)). The dMRI data is generally acquired by repeating a dMRI acquisition with varying diffusion encodings that include directional (e.g., 3D) and weighting (e.g., b-value) information associated with the diffusion properties of the water. The diffusion encodings span a 3D space, also known as q-space.

Acquiring a complete data set to fill the q-space (3D space) and generate high resolution images may result in extended scan times. In general, patient movement is limited during MRI acquisitions (e.g., the patient may not be allowed to move). Therefore, the extended scan times may result in patient discomfort, and in certain situations the patient may be unable to remain still during acquisitions. Patient movement during MRI data acquisition may result in poor image quality. Accordingly, it may be desirable to decrease data acquisition times for dMRI techniques to decrease patient discomfort and movement during imaging. A technique for decreasing dMRI acquisition times may be to undersample the q-space data and using mathematical algorithms to transform the undersampled q-space data into a fully sampled data set (e.g., a data set that has not been undersampled during data acquisition), which may be referred to as a reconstructed data set, and reconstruct an image. However, due, in part, to the missing q-space data (e.g., undersampled data), images may include artifacts and have undesirable resolution. In accordance with present embodiments, model-based techniques that combine spherical deconvolution (SD) and compressed sensing are used to denoise and process q-space data (e.g., undersampled q-space data) to generate images similar to images generated from a full q-space data set. In this way, dMRI q-space data acquisition times may be accelerated without affecting image quality. Indeed, the present embodiments improve image resolution and/or quality compared to the conventional dMRI acquisition and processing techniques.

The embodiments described herein may be performed by a magnetic resonance imaging (MRI) system, wherein specific imaging routines (e.g., diffusion MRI sequences) are initiated by a user (e.g., a radiologist). Thus, the MRI system may perform data acquisition, data construction, and image synthesis. Accordingly, referring to FIG. 1, a magnetic resonance imaging system 10 is illustrated schematically as including a scanner 12, scanner control circuitry 14, and system control circuitry 16. According to the embodiments described herein, the MRI system 10 is generally configured to perform MR imaging, such as imaging sequences for diffusion imaging. System 10 additionally includes remote access and storage systems or devices such as picture archiving and communication systems (PACS) 18, or other devices such as teleradiology equipment so that data acquired by the system 10 may be accessed on- or off-site. In this way, MR data may be acquired, followed by on- or off-site processing and evaluation. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

Scanner 12 includes a series of associated coils for producing controlled magnetic fields for exciting the gyromagnetic material within the anatomy of the subject being imaged. Specifically, a primary magnet coil 28 is provided for generating a primary magnetic field, $B_0$, which is generally aligned with the bore 22. A series of gradient coils 30, 32, and 34 permit controlled magnetic gradient fields to be generated for positional encoding of certain of the gyromagnetic nuclei within the patient 26 during examination sequences. A radio frequency (RF) coil 36 is configured to generate radio frequency pulses for exciting the certain gyromagnetic nuclei within the patient. In addition to the coils that may be local to the scanner 12, the system 10 also includes a set of receiving coils 38 (e.g., an array of coils) configured for placement proximal (e.g., against) to the patient 26. As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state.

The various coils of system 10 are controlled by external circuitry to generate the desired field and pulses, and to read emissions from the gyromagnetic material in a controlled manner. In the illustrated embodiment, a main power supply 40 provides power to the primary field coil 28. A driver circuit 42 is provides power to pulse the gradient field coils 30, 32, and 34. Such a circuit may include amplification and control circuitry for supplying current to the coils as defined by digitized pulse sequences output by the scanner control circuit 14, which in one embodiment may be a diffusion imaging module. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry configured to generate the RF pulses. Similarly, the receiving coils 38 are connected to switch 46, which is capable of switching the receiving coils 38 between receiving and non-receiving modes. Thus, the receiving coils 38 resonate with the RF signals produced by relaxing gyromagnetic nuclei from within the patient 26 while in the receiving mode, and they do not resonate with RF energy from the transmitting coils (i.e., coil 36) so as to prevent undesirable operation while in the non-receiving mode. Additionally, a receiving circuit 48 is configured to receive the data detected by the receiving coils 38, and may include one or more multiplexing and/or amplification circuits.

It should be noted that while the scanner 12 and the control/amplification circuitry described above are illustrated as being coupled by a single line, that many such lines may occur in an actual instantiation. For example, separate lines may be used for control, data communication, and so on. Further, suitable hardware may be disposed along each type of line for the proper handling of the data. Indeed, various filters, digitizers, and processors may be disposed between the scanner and either or both of the scanner and system control circuitry 14, 16. By way of non-limiting example, certain of the control and analysis circuitry described in detail below, although illustrated as a single unit, includes additional hardware such as image reconstruction hardware configured to perform the data processing techniques described herein.

As illustrated, scanner control circuit 14 includes an interface circuit 50, which outputs signals for driving the gradient field coils and the RF coil and for receiving the data representative of the magnetic resonance signals produced in examination sequences. The interface circuit 50 is coupled to a control and analysis circuit 52. The control and analysis circuit 52 executes the commands for driving the circuit 42 and circuit 44 based on defined protocols selected via system control circuit 16. Control and analysis circuit 52 also serves to receive the magnetic resonance signals and performs subsequent processing before transmitting the data to system control circuit 16. Scanner control circuit 14 also includes one or more memory circuits 54, which store configuration parameters, pulse sequence descriptions, examination results, and so forth, during operation. As noted above, in one embodiment, the scanner control circuit 14 may correspond to all or a part of a diffusion imaging module.

Interface circuit 56 is coupled to the control and analysis circuit 52 for exchanging data between scanner control circuit 14 and system control circuit 16. In certain embodiments, the control and analysis circuit 52, while illustrated as a single unit, may include one or more hardware devices.

Further, in certain embodiments, system control circuit 16 may be a part of the diffusion imaging module. The system control circuit 16 includes an interface circuit 58, which receives data from the scanner control circuit 14 and transmits data and commands back to the scanner control circuit 14. The interface circuit 58 is coupled to a control and analysis circuit 60 which may include a CPU in a multipurpose or application specific computer or workstation. Control and analysis circuit 60 is coupled to a memory circuit 62 to store programming code for operation of the MRI system 10 and to store the processed image data for later reconstruction, display and transmission. The programming code may execute one or more algorithms that, when executed by a processor, are configured to perform reconstruction of acquired q-space data to obtain both angular and radial information associated with incoherent motion (e.g., diffusion) of the gyromagnetic nuclei throughout the patient's tissue to generate spatially resolved fiber orientation distributions (FODs), quantitative maps, or other images of the patient's tissue. The spatially resolved FODs may be used to visualize fiber crossings or to generate fiber tractograms. For example, as discussed in further detail below, the spatially resolved FODs, as well as the quantitative tissue maps, may be generated based on one or more algorithms that employ generalized spherical deconvolution.

An additional interface circuit 64 may be provided for exchanging image data, configuration parameters, and so forth with external system components such as remote access and storage devices 18. Finally, the system control and analysis circuit 60 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

It should be noted that the MRI system described is merely intended to be exemplary only, and other system types, such as so-called "open" MRI systems may also be used. Similarly, such systems may be rated by the strength of their primary magnet, and any suitably rated system capable of carrying out the data acquisition and processing described below may be employed. Indeed, at least a portion of the disclosed methods may be performed by the system 10 described above with respect to FIG. 1. That is, the MRI system 10 may perform the acquisition techniques described herein, and, in some embodiments, the data processing techniques described herein. It should be noted that subsequent to the acquisitions described herein, the system 10 may simply store the acquired data for later access locally and/or remotely, for example in a memory circuit (e.g., memory 62). Thus, when accessed locally and/or remotely, the acquired data may be manipulated by one or more processors contained within an application-specific or general-purpose computer. The one or more processors may access the acquired data and execute routines stored on one or more non-transitory, machine readable media collectively storing instructions for performing methods including the diffusion imaging methods described herein. For example, the one or more processors may apply compressed sensing, separately or in combination with spherical deconvolution, to the acquired data.

Figure 2:
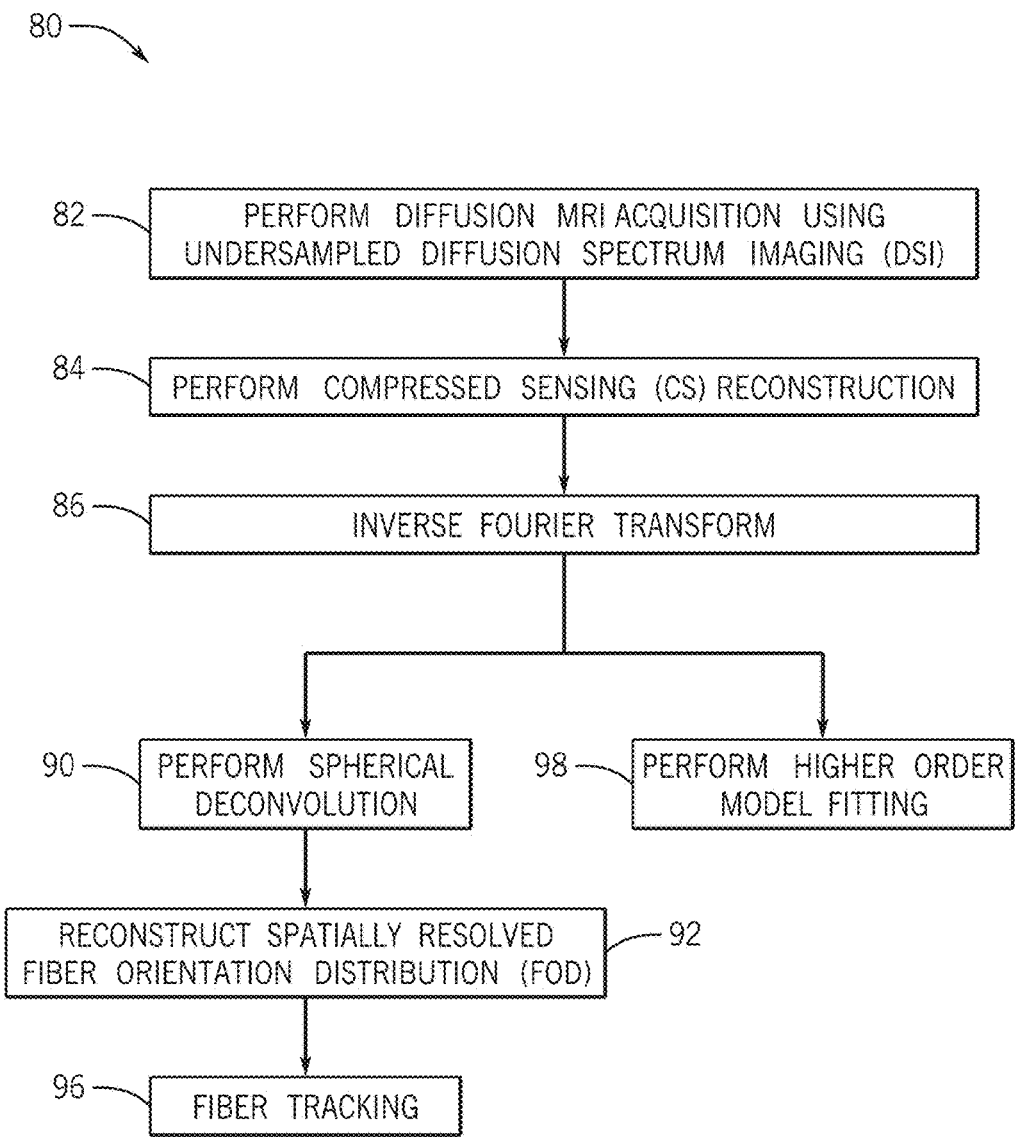
FIG. 2 is a process flow diagram depicting an embodiment of a method for obtaining spatially resolved fiber orientation distributions (FODs) by performing compressed sensing on undersampled diffusion spectrum imaging (DSI) data followed by spherical deconvolution in accordance with an aspect of the present disclosure.

One such method 80 is illustrated as a process flow diagram in FIG. 2. In particular, method 80 includes a number of steps configured to process q-space data (e.g., diffusion encoding data, 3D data) to characterize both angular and radial components associated with diffusion characteristics of water within the patient's tissue being imaged (e.g., nerve fibers). The method 80 begins with performing a diffusion MRI acquisition using undersampled diffusion spectrum imaging (DSI) (block 82). The DSI acquisition includes diffusion pulse sequences for acquiring data in the form of a set of signals from a three-dimensional (3D) region of interest (e.g., a tissue of the patient). By way of non-limiting example, the acquisition may include a spin-echo or double-spin-echo echo-planar imaging pulse sequence having diffusion-sensitizing gradient pulses. The pulse sequence produces a series of MR images (after complex Fourier transformation in k-space), with each image representing one point in q-space. The images constitute a complex diffusion-encoded data set containing angular and radial information relating to underlying tissue anisotropy and geometric restrictions in the diffusion process, respectively. The acquired signals at each of the q-space locations represent the three-dimensional (3D) displacement distribution of the spins of the gyromagnetic material (e.g., protons in water) in each voxel. The signals obtained according to block 82 may include signals corresponding to one of the diffusion encodings and may be representative of a three-dimensional distribution of displacement of magnetic spins of the gyromagnetic nuclei (e.g., the proton in the water) present in each imaging voxel.

As should be noted, the signals may be acquired using methods other than diffusion spectrum imaging (DSI), which acquires signals on a Cartesian grid. For example, the signals may be acquired using high angular resolution diffusion imaging (HARDI) or q-ball imaging, which represent subsets of q-space imaging with acquisitions on one spherical single shell (e.g., HARDI) or multiple concentric spherical shells instead of a full Cartesian grid.

The most comprehensive diffusion information is typically obtained using an acquisition that satisfies the Nyquist criterion. The acquisition according to block 82 will typically be of a high dimensionality—including three dimensions in the spatial domain (e.g., k-space) and three dimensions in the q-space domain, and in certain embodiments, may be performed at the Nyquist rate. As discussed above, the scan time for certain dMRI sequences may be relatively long, which may limit clinical in vivo applications of dMRI. To reduce dMRI scan time, in certain embodiments, less than all of the q-space data may be acquired. In other words, as an alternative acquisition method, the q-space data may be undersampled (e.g., sampled below the Nyquist rate). The acquisition trajectory employed in such embodiments may be any suitable trajectory, such as a non-uniform (e.g., a random or pseudo-random) pattern, a regularly sampled pattern of sparsely sampled locations, and so on. In one embodiment, the pattern may not be evenly distributed. Sampling of the q-space may be within any desired radius of the q-space. In certain embodiments, a center region of the q-space is sampled more densely compared to other non-central regions within the q-space. Examples of undersampling schemes that may be used for q-space data include, but are not limited to, uniform random distribution, Poisson disk, and Gaussian. As should be noted, the number of samples in q-space may be determined by the Nyquist sampling rate and image acquisition time.

In embodiments where fewer than the total available q-space locations are sampled, the method 80 may include reconstructing q-space encodings for unsampled q-space locations using compressed sensing reconstruction (block 84) so as to generate an ensemble average propagator (EAP) and to produce a set of uniformly distributed q-space data points using the inverse Fourier transform (block 86) on the EAP. Due to the random or pseudo-random nature of the undersampling pattern, compressed sensing may enable the reconstruction of missing q-space data. Compressed sensing may recover the missing q-space data by exploiting generic prior knowledge about the q-space data such as signal sparsity or minimal total variation (TV). However, in certain embodiments, parallel imaging reconstruction techniques could potentially be utilized for synthesizing missing spatial data.

As will be understood by those of skill in the art, compressed sensing is a technique in which data is both acquired and then reconstructed. In compressed sensing, it is desired that the image have a sparse representation in a known transform domain (such as the wavelet domain) and that aliasing artifacts due to q-space undersampling be incoherent in that transform domain (i.e., noise-like). That is, the data-sampling pattern is chosen so as to reduce coherency in the sparse domain. This incoherence may be achieved by randomly undersampling the q-space encodings. The undersampling of the q-space encodings may result in aliasing, and when the undersampling is random, the aliasing is incoherent and acts as incoherent interference of the sparse transform coefficients.

Accordingly, the sampling in accordance with block 82 may be a pattern that is amenable to reconstruction using a compressed sensing algorithm to produce the EAP used for fiber tracking and/or quantitative mapping. While any suitable compressed sensing algorithm may be used for reconstruction (e.g., estimation), in one embodiment, the reconstruction may be performed using a non-linear reconstruction scheme. By way of example, an L1-norm constraint in a cost function minimization method may be used to recover sparse transform coefficients that may be used to compute the EAP. In this way, the EAP may be reconstructed for an undersampled q-space data set.

As discussed above, the EAP may be reconstructed using compressed sensing of the q-space data may be retransformed. For example, an inverse Fourier transform may be applied to the EAP (block 86). The inverse Fourier transform retransforms the reconstructed EAP into a fully sampled q-space data set, which may be used for fiber tracking and/or quantitative mapping. In the inverse Fourier transform, at least a portion of the reconstructed q-space data (e.g., synthesized data) may be replaced with corresponding acquired q-space data (e.g., the undersampled q-space data generated according to block 82), thereby generating a fully sampled q-space data set. As should be noted, in certain embodiments, reconstruction and re-transformation of the undersampled q-space data (e.g., according to blocks 84, 86) before spherical deconvolution processing may be omitted, as discussed in further detail below with reference to FIG. 5.

Following re-transformation of the EAP, spherical deconvolution may be applied (block 90) to the re-transformed q-space data to produce the spatially resolved fiber orientation distributions (FODs) (block 92). For example, in certain embodiments, generating the spatially resolved FODs includes reconstructing the ensemble average propagator (EAP) using compressed sensing, transforming the reconstructed EAP back to a fully sampled DSI data set, and performing spherical deconvolution on the fully sampled DSI data set. Once reconstructed the spatially resolved FODs may be used for visualizing fiber crossings or for fiber tracking (block 98). Fiber tracts generated using the reconstructed spatially resolved FODs may have a better resolved fiber peaks compared to tracts generated using orientation distribution functions (ODFs), thereby increasing the accuracy of fiber crossings and fiber tractography generated from undersampled DSI data.

Generally, fast Fourier transform is performed in q-space to produce the EAP. The EAP is further processed by integrating over a set of weighted reconstructions of a diffusion propagator to produce the ODF. The spatially resolved ODFs may be used as an input for tractography.

However, the angular resolution of the ODFs may be affected by the weighting (e.g., b-value) information associated with the diffusion properties of the water. For example, a low $b_{max}$ (e.g., less than approximately 3,000 seconds/square millimeter ($s/mm^2$)) may result in blurred ODFs, and a high $b_{max}$ (e.g., greater than approximately 6,000 $s/mm^2$) may have an undesirable signal-to-noise ratio, thereby decreasing the sensitivity of the ODFs for fiber tracking applications. Therefore, to improve the quality of the fiber tracts generated from diffusion spectrum imaging (DSI) q-space data, the reconstructed q-space data may be processed using spherical deconvolution algorithms to generate the spatially resolved FODs that may be used for high resolution fiber tracking rather than using ODFs.

The spherical deconvolution model that may be used to reconstruct the spatially resolved FOD is expressed as follows:

$$S(b,q)=\Sigma_i f_i e^{-\lambda_\| b (q^T u_i)^2} e^{-\lambda_\perp b(1-(q^T u_i)^2)} + v_{GM} e^{-\lambda_{GM} b} + v_{CSF} e^{-\lambda_{CSF} b} \quad (EQ.1)$$

$$S=[H, h_{GM}, h_{CSF}]*[f; v_{GM}; v_{CSF}] \quad (EQ.2)$$

where $\lambda_\|$, $\lambda_\perp$, $\lambda_{GM}$, and $\lambda_{CSF}$ represent diffusivity constants for (anisotropic) white matter (parallel and orthogonal, respectively, to the white matter fiber direction) and for (isotropic) grey matter (GM), and cerebral spinal fluid (CSF), respectively, $f_i$ is the wanted fiber orientation distribution (FOD) in the direction $u_i$, $v_{GM}$ and $v_{CSF}$ are the wanted volume fractions of GM and CSF, respectively, b and q are the strength and the direction, respectively, of the diffusion weighting used to acquire the data S. EQ. 2 is the matrix-vector notation for the spherical deconvolution model. EQs. 1 and 2 may be used for multi-shell or Cartesian grid (DSI) acquisition and processing techniques. For single-shell data the model is simplified by removing the isotropic components.

Figure 3:
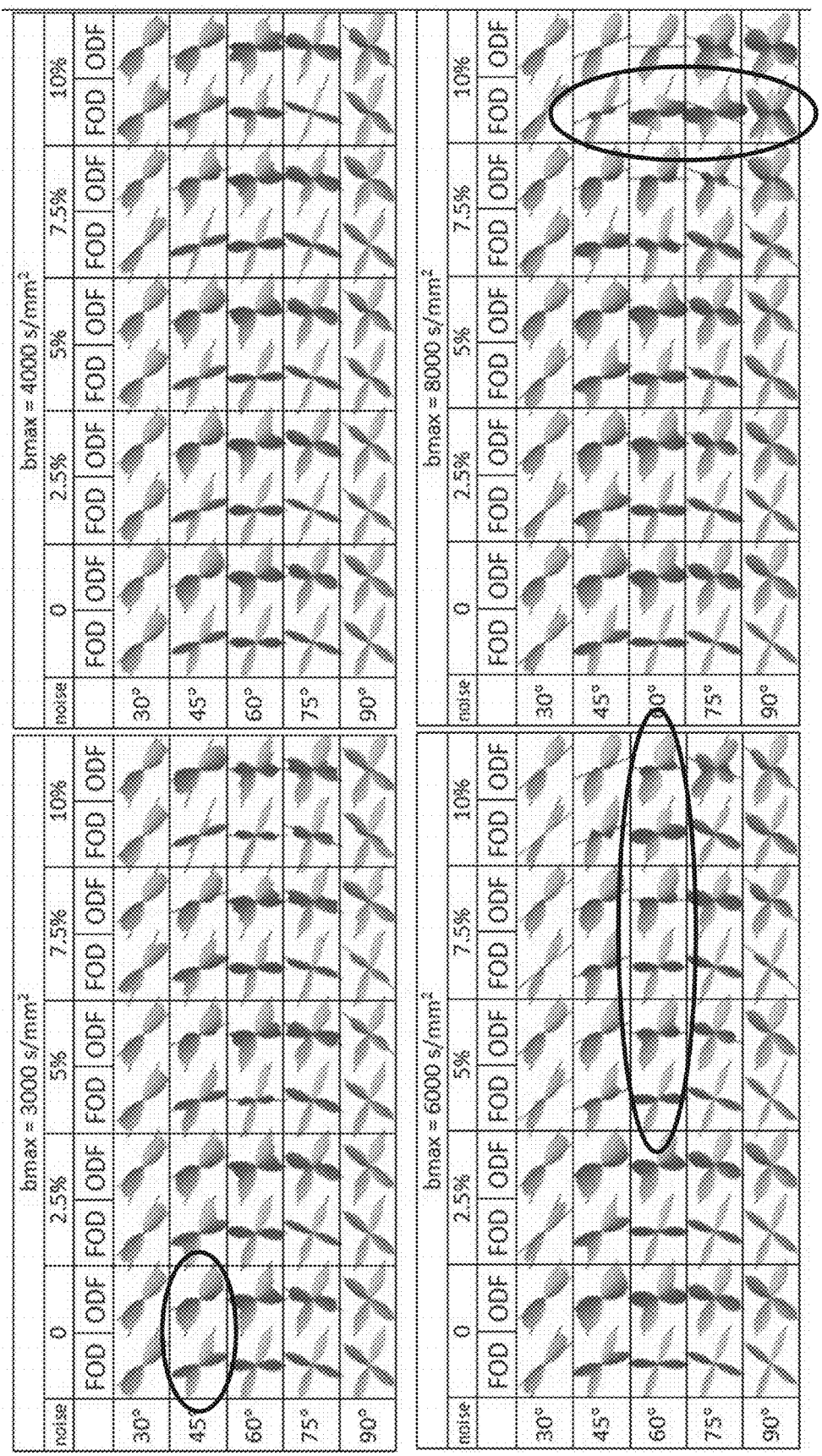
FIG. 3 is an embodiment of example fiber crossing plots comparing FODs generated from simulated DSI data according to the method of FIG. 2 and orientation distribution functions (ODFs) generated by integrating over a set of weighted reconstructions of the diffusion propagator obtained via a Fourier transform of the same simulated DSI data.

FIG. 3 illustrates reconstructed FODs, according to block 90, and orientation distribution functions (ODF) for simulated q-space data (Gaussian mixture model, FA=0.8, $D_\|$=1E−3 $mm^2$/s, 11-cube DSI) at various $b_{max}$ values, noise levels, and crossing angles. As illustrated, in FIG. 3, the fiber crossings generated based on the reconstructed spatially resolved FOD are equally or better defined for $b_{max}$ values of 3,000-8,000 $s/mm^2$ compared to ODF, with the exception of fiber crossings at a $b_{max}$ of 8,000 $s/mm^2$ (e.g., high $b_{max}$) and approximately 10% noise. Accordingly, it is now recognized that by combining the denoising associated with compressed sensing and the use of an FOD generated from spherical deconvolution, higher resolution fiber images may be obtained at a wide range of b values.

Figure 4:
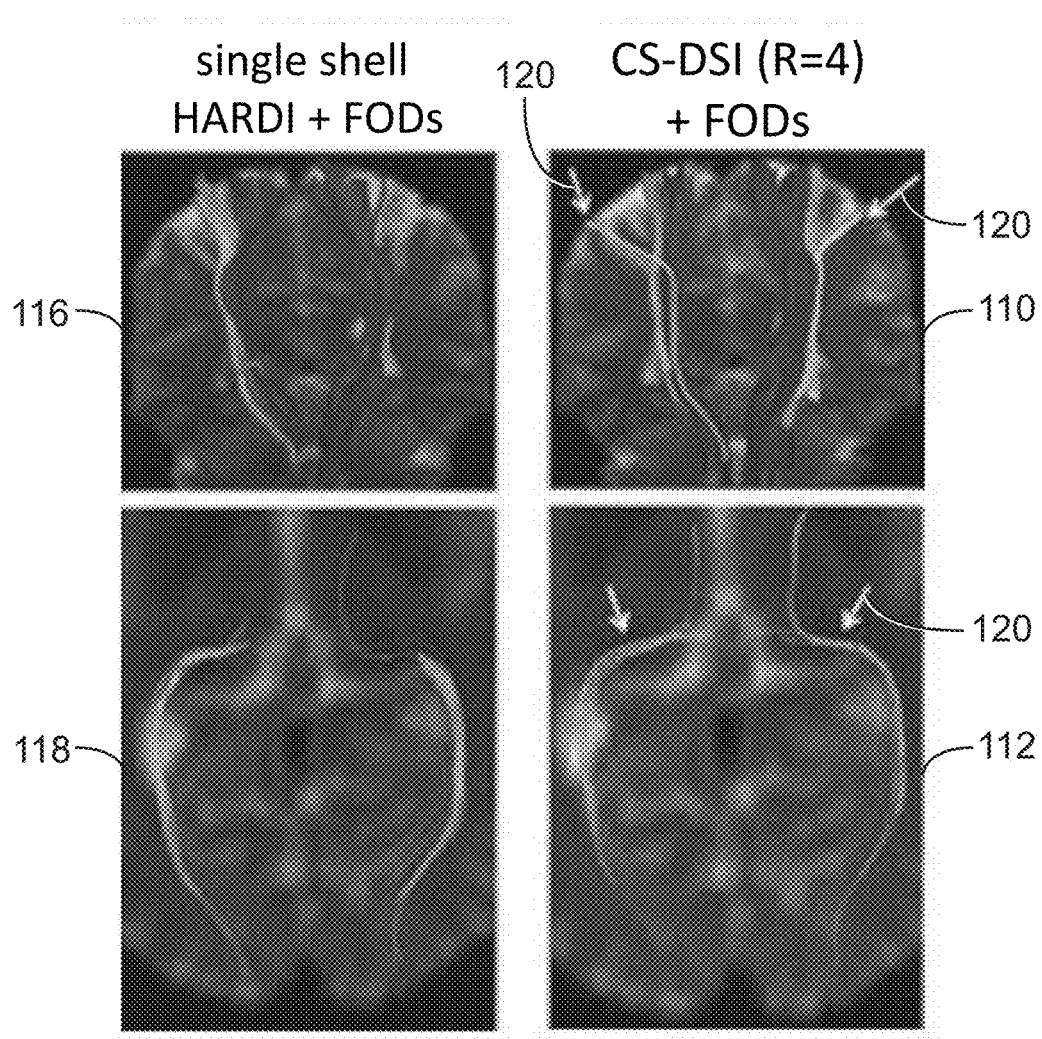
FIG. 4 depicts example tractography images generated from spatially resolved FODs computed from two different data sets having comparable data acquisition times; one is produced from a single-shell high angular resolution diffusion imaging (HARDI) acquisition and the other one is produced from undersampled DSI data using compressed sensing and spherical deconvolution according to the method of FIG. 2 in accordance with an aspect of the present disclosure.

Moreover, experiments on a healthy volunteer were performed on a 3T GE MR750 clinical MR scanner (GE Healthcare, Milwaukee, Wis., USA) using a 32-Channel Head Coil and acquiring two single shot echo planar imaging (EPI) acquisitions (ASSET factor 2, 2.5 mm isotropic resolution), first an undersampled DSI acquisition (11 cube, R=4, $b_{max}$=6,000 $s/mm^2$) and second a single-shell HARDI acquisition (150 directions, b=3,000 $s/mm^2$). As illustrated in FIG. 4, undersampled diffusion spectrum imaging (DSI) techniques using a combination of compressed sensing, according to block 84, and spherical deconvolution, according to block 90, to process the dMRI signals may improve fiber tractography resolution compared to high angular resolution diffusion imaging (HARDI) q-space data processing techniques. For example, images 110, 112 illustrate motor-tracts and optic radiation tracts, respectively, in a patient's brain tissue generated using the method 80. Similarly, images 116, 118 illustrate motor-tracts and optic radiation tracts, respectively, in the patient's brain tissue generated via single-shell HARDI and spherical deconvolution techniques. As shown by arrows 120, fiber angles and orientations are better resolved in tract images 110, 112 compared to tract images 116, 118.

In addition to fiber tracking, the re-transformed q-space data (e.g., synthesized to fully sampled q-space data), generated according to block 86 may also be used to produce additional information associated with the diffusion of the water within the patient's tissue. For example, in certain embodiments, a higher order model fitting (block 98) may be used to fit the re-transformed reconstructed q-space data and generate the quantitative maps (e.g., mean diffusivity (MD), fractional anisotropy (FA), mean kurtosis, radial kurtosis, and/or neurite dispersion NODDI)) of the patient's tissue.

Figure 5:
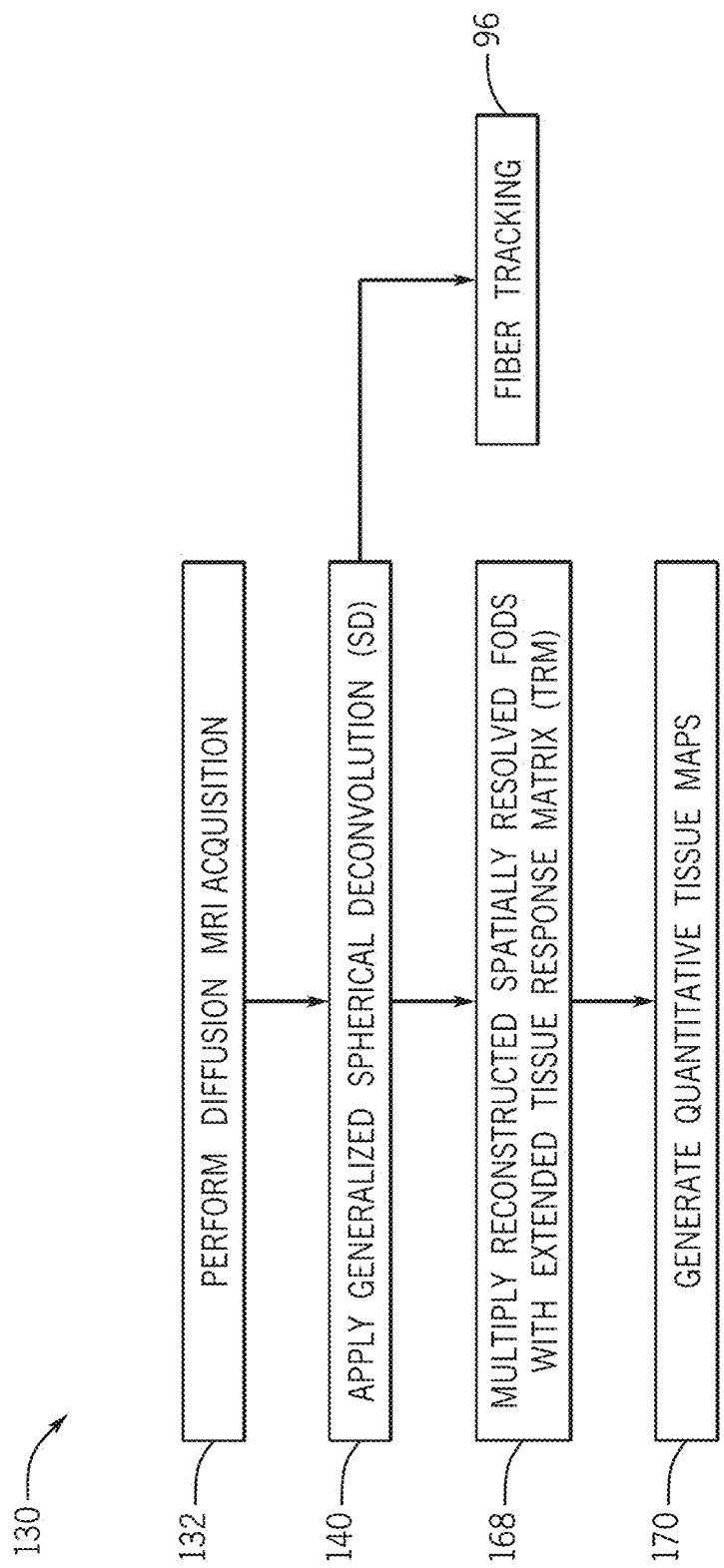
FIG. 5 is a process flow diagram depicting an embodiment of a method for obtaining spatially resolved FODs and/or quantitative tissue maps from diffusion MRI (dMRI) data based on a generalized spherical deconvolution algorithm.

As discussed above, certain embodiments of the present disclosure may use any aspect of compressed sensing for generating spatially resolved FODs (e.g., according to block 84 of method 80). For example, FIG. 5 illustrates a method 130 for analyzing and denoising q-space data to spatially resolve fiber orientation distributions (FODs) using a generalized spherical deconvolution algorithm. Method 130 begins with performing a diffusion MRI (dMRI) acquisition (block 132) to generate q-space data. The dMRI acquisition may be done using any suitable dMRI acquisition technique such as a diffusion spectrum imaging (DSI) acquisitions (e.g., Cartesian grid acquisition), a single-shell acquisition (e.g., HARDI), or a multi-shell acquisition. The sampling may be complete (e.g., satisfies the Nyquist criterion) or incomplete (to generate an undersampled data set).

Following acquisition of the q-space data, the method 130 applies a generalized spherical deconvolution algorithm (block 140) to the q-space generated in accordance with block 132. The generalized spherical deconvolution algorithm may include a least squares formulation and, in certain embodiments, a compressed sensing regularization term. The compressed sensing regularization term may promote sparsity of the spatially resolved FODs. In certain embodiments, the compressed sensing regularization term may promote sparsity by minimizing the L1-norm associated with the spatially resolved FODs. Additionally, the compressed sensing regularization term may promote smoothness of the spatially resolved FODs. As discussed in further detail below, the smoothness may be promoted by minimization of the total variation (TV) of the spatially resolved FODs. For example, given the measured q-space data d for a particular voxel in a single-shell (HARDI) acquisition, the matrix notation for the standard spherical deconvolution task is as follows:

$$\min_f \|Hf-d\| \: s.t. f \geq 0 \quad (EQ.3)$$

where H is the fiber response function matrix and f is the wanted fiber orientation distribution (FOD). A non-negativity constraint is imposed to avoid negative fibers (e.g., physically meaningless information). The number of potential fiber directions (e.g., the size of f) is usually greater than the number of measurements (e.g., the size of d), resulting in an underdetermined system (e.g., the matrix H is non-quadratic). Systemically reducing the number of measured data points (e.g., undersampling d) may decrease determinacy and result in increased blurring of the FOD. However, the application of compressed sensing to the spherical deconvolution task may recover the original resolution (e.g., sharpness) of the FOD. Therefore, in certain embodiments, a compressed sensing (CS) regularizer may be applied to the spherical deconvolution to generate a generalized spherical deconvolution. The matrix notation for the generalized spherical deconvolution may be expressed as shown in EQs. 4.

$$\min_f \Psi(f) \, s.t. \, \|Hf - d\| < \varepsilon, f \geq 0 \quad (EQ. 4)$$

where $\Psi$ is a regularizer (e.g., the total variation (TV) of f, the 1-norm ($\|\cdot\|_1$) of f, or the 1-norm of a transform of f) and $\varepsilon$ a noise dependent small scalar.

EQs. 4 and may be solved by using an alternating direction algorithm capable of handling non-negativity constraints or an iterative shrinkage/thresholding algorithm (ISTA), respectively. For example, for $\Psi = \|\cdot\|_1$, i.e. if f is assumed to be sparse, the alternating direction algorithm may be applied.

For $\Psi$ being the Total Variation (TV) of f, the iterative shrinkage thresholding algorithm (ISTA) approach may be used yielding a smooth plateau of constant value, thereby separating background and distinct peaks in the FOD. Because f is defined on a surface of a single sphere, $\Psi$ is adapted for non-Cartesian sampling. Accordingly, the generalized spherical deconvolution based on EQ. 4 promotes sparsity of f (e.g., fiber direction), and decreases spurious fiber directions compared to conventional spherical deconvolution techniques.

In other embodiments, the spherical deconvolution model may be generalized to include multiple diffusivity values for anisotropic components, isotropic components, or a combination thereof within each imaging voxel (e.g., 3D space). As such, the multiplication of the reconstructed FODs with the extended Tissue Response Matrix (TRM) may yield denoised q-space data due, in part, to allowing multiple degrees of freedom via the algorithm. As shown above with regard to EQs. 1 and 2, conventional spherical deconvolution algorithms use a single set of diffusivities (e.g., $\lambda_\|$, $\lambda_\perp$, $\lambda_{GM}$, $\lambda_{CSF}$). However, by incorporating multiple diffusivities into the spherical deconvolution algorithm the q-space data may be denoised, thereby increasing image quality for quantitative tissue mapping. The generalized spherical deconvolution algorithm that incorporates multiple diffusivities is expressed as follows in EQs. 5-7:

$$S(b,q) = \sum_j f_{j,i} e^{-\lambda_{\|j} b (q^T u_i)^2} e^{-\lambda_{\perp j} b (1-(q^T u_i)^2)} + \sum_k v_{GM,k} e^{-\lambda_{GM,k} b} + \sum_l V_{CSF,l} e^{-\lambda_{CSF,l} b} \quad (EQ. 5)$$

$$S = [H_1 \ldots H_J H_{GM} H_{CSF}] * [f_1 \ldots f_J; v_{GM}; v_{CSF}] =: H_{gen} \cdot f_{gen} \quad (EQ. 6)$$

$$\min_{f_{gen}} \|H_{gen} * f_{gen} - d\| \, s.t. \, f \geq 0 \quad (EQ. 7)$$

where the subscripts j, k, and l are subscripts for different diffusivity coefficients for anisotropic and isotropic components, respectively. EQ. 7 may be solved using the compressed sensing regularization discussed above.

Based on the generalized spherical deconvolution algorithms and matrices expressed in EQ. 4, the spatially resolved FODs may be used for fiber tracking (block 96) as discussed above. For example, single-shell simulations of fiber crossings were performed using a Gaussian mixture model (FA=0.8, $D_\| = 1E-3 \, mm^2/s$, b=3000 s/mm$^2$, 128 directions) with varying crossing angles (e.g., between 30° and 90°) and up to 10% additive Rician noise. The generalized spherical deconvolution algorithm (e.g., EQ. 4, $\Psi = \|\cdot\|_1$, Alternating Direction Algorithm) and damped Richardson-Lucy-Algorithm (dRLA) according to EQ. 3 were used to compute FODs. Subsequently, fiber peaks were detected using a simple neighborhood comparison.

Experiments on a healthy volunteer were performed on a 3T GE MR750 clinical MR scanner (GE Healthcare, Milwaukee, Wis., USA) using a 32-Channel Head Coil single shot echo planar imaging (EPI) HARDI acquisition (150 directions at b=3,000 s/mm$^2$, 1.8 mm isotropic resolution). Data was randomly undersampled with factor R=3 yielding a single-shell data set with 50 directions. Spherical deconvolution was performed on the fully sampled data using damped Richardson-Lucy-Algorithm (dRLA), e.g., EQ. 3, to generate a reference image. In addition, the undersampled q-space data was processed using both dRLA, EQ. 3, and the generalized spherical deconvolution expressed in EQ. 4 with $\Psi$ being the Total Variation using the Iterative Shrinkage/Thresholding Algorithm (ISTA).

Figure 6:
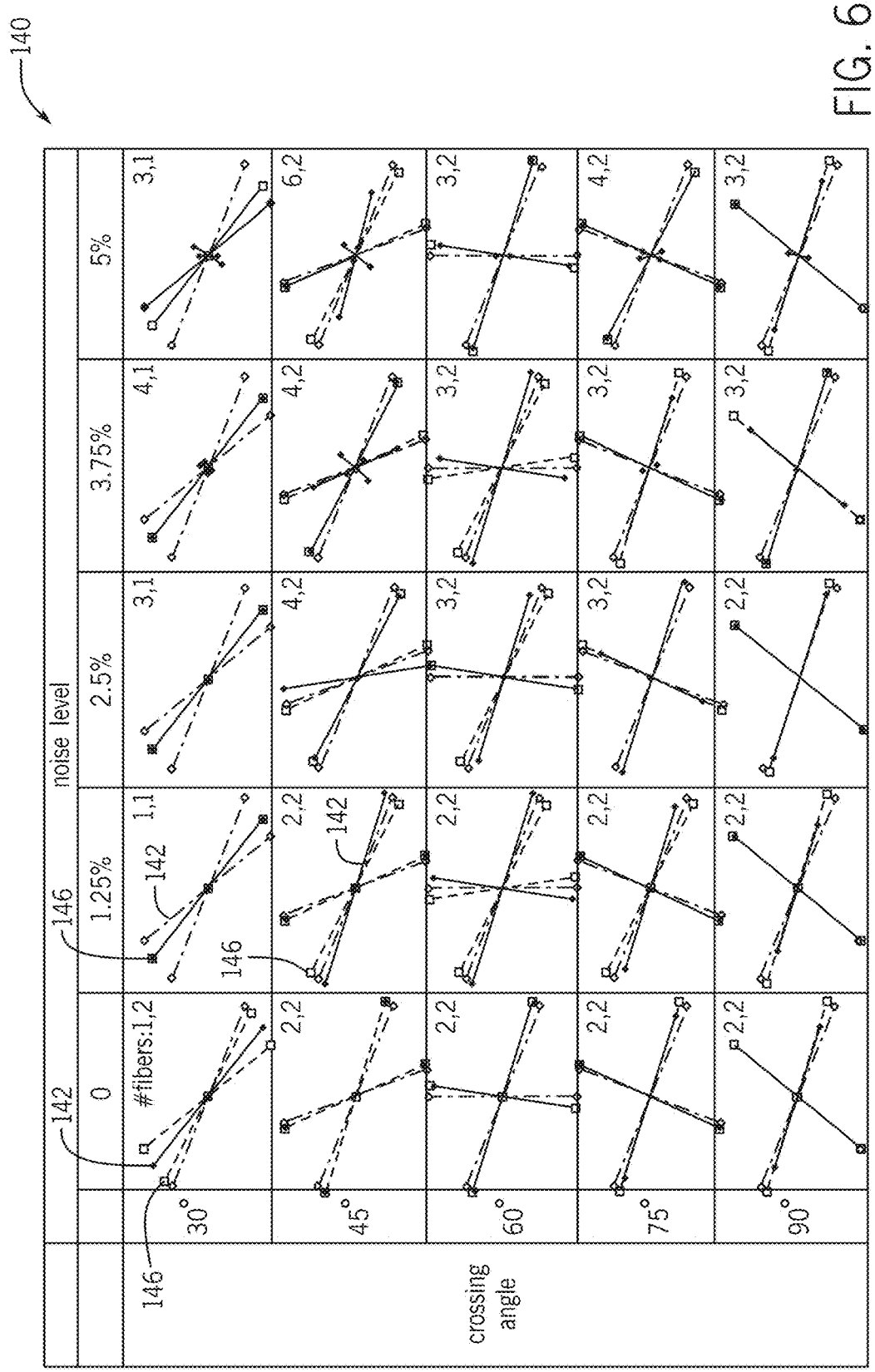
FIG. 6 depicts example fiber crossing plots comparing fiber peaks detected from FODs generated according to the method of FIG. 5 and from a damped Richardson-Lucy algorithm (dRLA)

FIG. 6 illustrates an array of example fiber crossing plots 140 showing detected fiber orientation distribution (FOD) peaks of a cross-fiber simulation study that compared FOD peaks derived from the generalized spherical deconvolution expressed in EQ. 4, $\Psi = \|\cdot\|_1$, alternating direction algorithm, and the conventional dRLA expressed in EQ. 3 at different noise levels (e.g., between 0% and 10%). As illustrated in the example fiber crossing plots 140, fiber peaks generated using conventional dRLA techniques (142) lead to spurious peaks for noisy data (e.g., noise levels above 0%). However, the peaks computed using the generalized spherical deconvolution algorithm (146) recovered correct peak counts and directions for various crossing angles independent of the noise level. In addition, the generalized spherical deconvolution derived fiber peaks 146 also show resolved peak crossing at a fiber angle of 30° in the noiseless case (e.g., approximately 0% noise). Note, numbers at the top right of each fiber crossing plot 140 indicate the number of FOD peaks detected, where the number on the left represents the FOD peaks detected using dRLA and the number on the right represents the FOD peaks detected using the method 130. For example, in the fiber crossing plot 140 for a noise level of 0% and a crossing angle of 30°, the number of FOD peaks detected using dRLA is 1 and the number of FOD peaks detected using the method 130 is 2.

Figure 7:
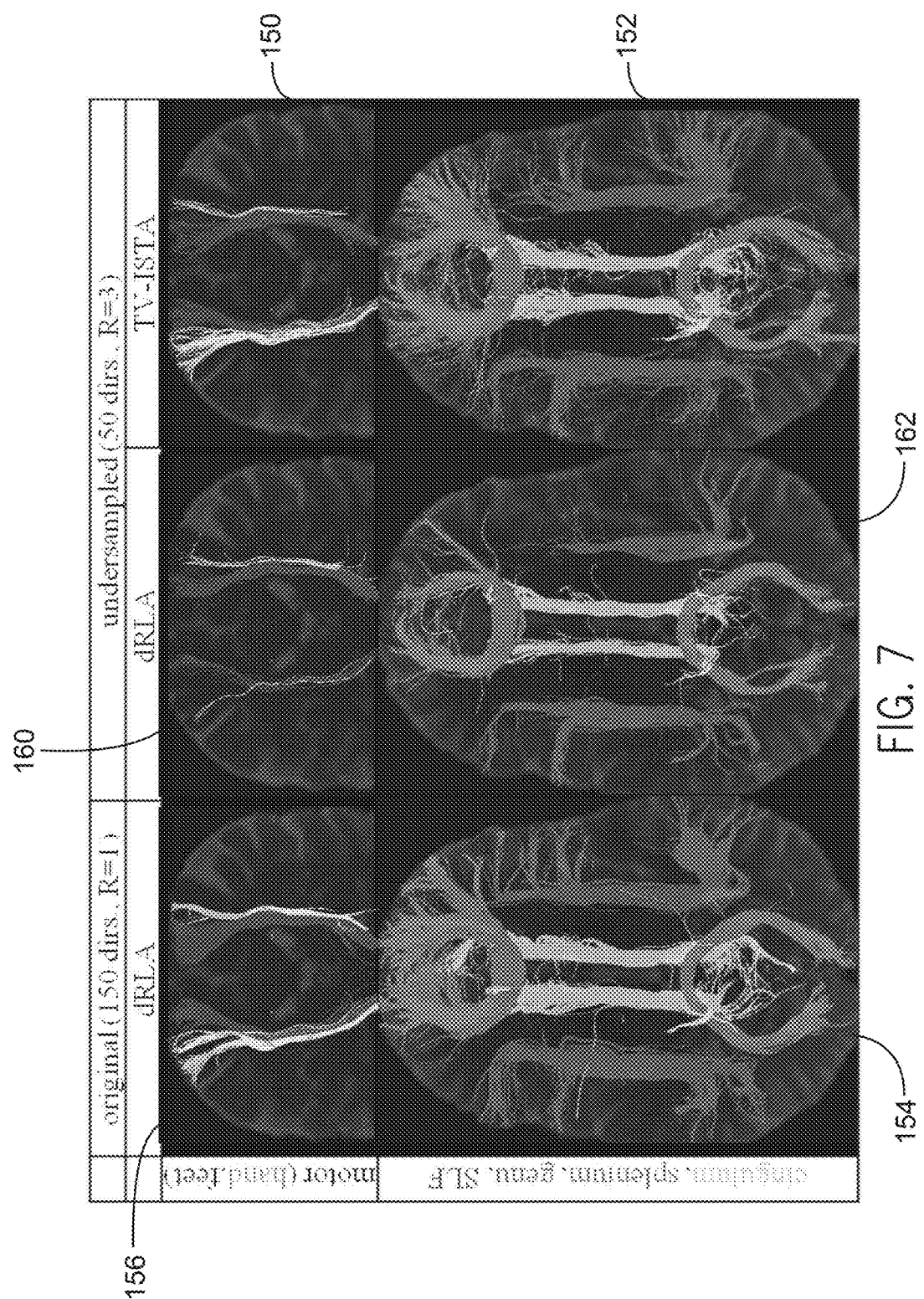
FIG. 7 is an embodiment of example tractography images generated from spatially resolved FODs generated according to the method of FIG. 5 and the damped Richardson-Lucy algorithm (dRLA)

FIG. 7 illustrates example fiber tracts using the derived TV-ISTA generalized spherical deconvolution algorithm expressed in EQ. 4, according to block 96. Besides having higher tract density, images generated based on EQ. 4 (e.g., TV-ISTA images 150, 152) using undersampled q-space data have similar fiber tracts compared to images generated based on the conventional dRLA algorithm expressed in EQ. 3 (e.g., reference images 154, 156) using a fully sampled q-space data set. That is, the TV-ISTA generalized spherical deconvolution algorithm in EQ. 4 recovered similar fiber tract information using only one third of the data compared to conventional dRLA processing for motor tracts and fine structures of the SLF branching out to the cerebral cortex. Moreover, as shown in undersampled dRLA images 160, 162 generated based on EQ. 3, fiber tract information of undersampled q-space data using conventional dRLA is not clearly resolved. Therefore, data processing q-space data using the disclosed EQs. 4 improves resolution of fiber peaks and fiber tracking compared to conventional dRLA processing. As such, desirable fiber peak and fiber tracking resolution may be achieved using data sets with fewer q-space sampling points, thereby decreasing the overall acquisition time for dMRI.

In addition to fiber tracking, the FODs generated using generalized spherical deconvolution according to EQs. 5-7 may be used to denoise q-space data and generate quantitative tissue maps. For instance, the method 130 includes multiplying the spatially resolved FODs generated according to block 140 with an extended tissue response matrix (TRM) (block 168), to reconstruct q-space data. In this way, the spatially resolved FODs may be used to go back to the q-space data and/or retransform potentially undersampled q-space data to a fully sampled q-space data set used to compute quantitative tissue maps (block 170) based on an output of the multiplication step. Moreover, due the multiple diffusivity components incorporated into the generalized spherical deconvolution algorithm (e.g., EQ. 5-7), the resolution and accuracy of the quantitative maps generated from undersampled q-space data are comparable to quantitative maps generated from a fully sampled q-space data set. Therefore, by using the disclosed generalized spherical deconvolution algorithms (EQ. 5-7) the q-space data may be undersampled and acquisition times may be decreased without decreasing image quality.

Figure 8:
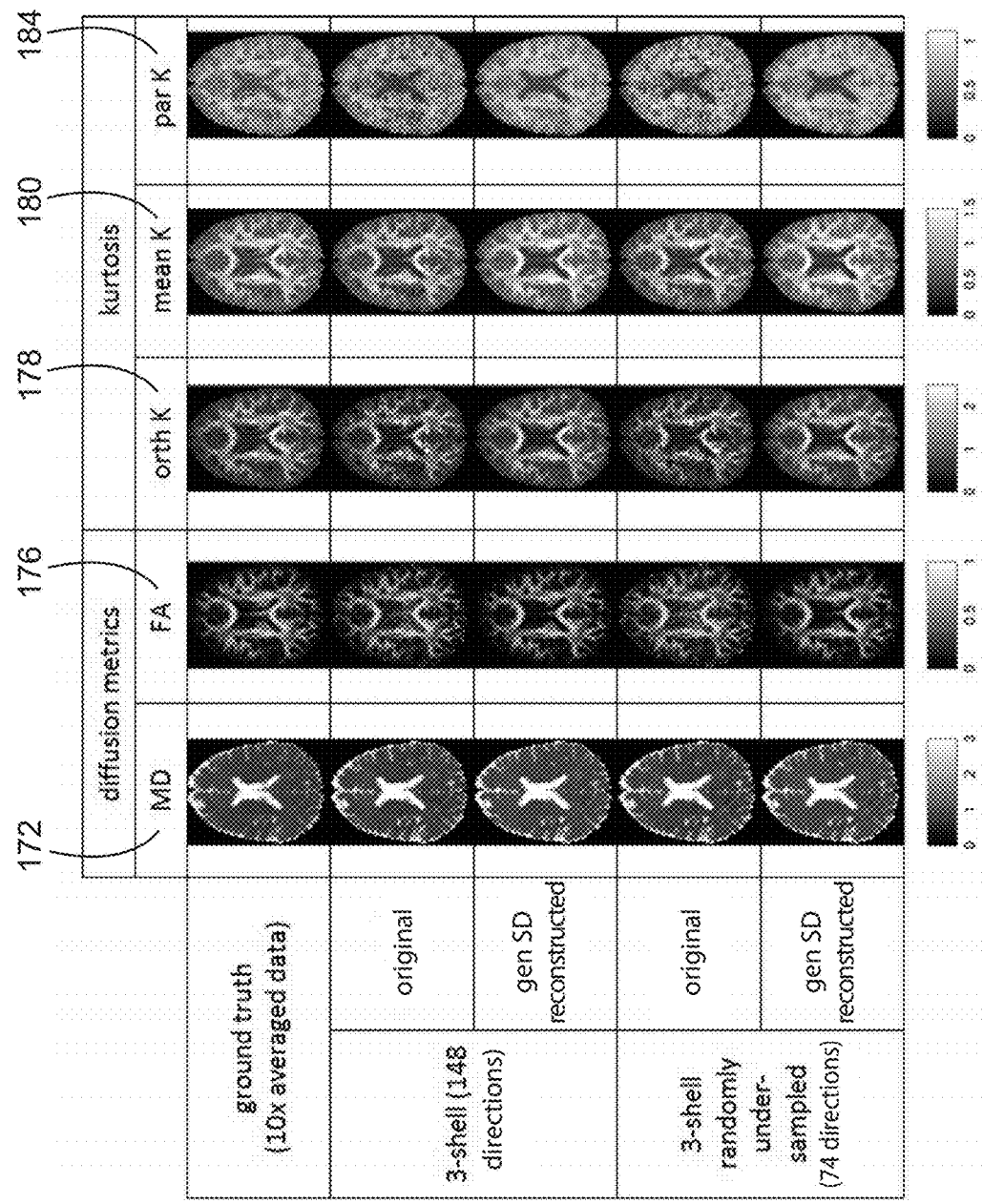
FIG. 8 is an embodiment of example quantitative tissue maps computed using the data generated according to the method of FIG. 5 and using the original data.

FIG. 8 illustrates example quantitative tissue maps for mean diffusivity (MD) 172, fractional anisotropy (FA) 176, orthogonal kurtosis (orth K) 178, mean kurtosis (mean K) 180, and parallel kurtosis (par K) 184 using higher order model fitting on either the original q-space data or the q-space data reconstructed using the generalized spherical deconvolution algorithms expressed in EQs. 5-7 for undersampled and fully sampled q-space data sets. The quantitative maps 172, 176, 178, 180, 184 were compared to a ground truth reference image generated from a tenfold averaged fully sampled q-space data. As shown, the quantitative maps 172, 176, 178, 180, 184 generated based on the reconstructed q-space data according to block 168 are comparable to the ground truth maps and, have increased image quality compared to maps generated using the original data. As such, the generalized spherical deconvolution algorithms (EQ. 5-7) enable denoising of the q-space data such that quantitative tissue maps may be generated with fewer q-space data points, thereby decreasing dMRI acquisition times.

This written description uses examples to disclose embodiments of the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging method, comprising:
generating spatially resolved fiber orientation distributions (FODs) from magnetic resonance signals acquired from a patient tissue using a plurality of diffusion encodings, each acquired magnetic resonance signal corresponding to one of the diffusion encodings and being representative of a three-dimensional distribution of displacement of magnetic spins of gyromagnetic nuclei present in each imaging voxel;
wherein generating the spatially resolved FODs comprises performing generalized spherical deconvolution using the acquired magnetic resonance signals and a modeled tissue response matrix (TRM) to reconstruct the spatially resolved FODs; and
using the spatially resolved FODs to generate a representation of fibrous tissue within the patient tissue.

2. The method of claim 1 wherein the generalized spherical deconvolution comprises a least squares formulation, and wherein using the generalized spherical deconvolution comprises adding a compressed sensing (CS) regularization term to the least squares formulation, and the CS regularization term incorporates prior knowledge about the patient tissue.

3. The method of claim 2, wherein using the spatially resolved FODs to generate the representation of fibrous tissue within the patient tissue comprises transforming the reconstructed FODs into diffusion encoding space by multiplication with the modeled TRM, and computing quantitative tissue maps based on an output of the multiplication step.

4. The method of claim 2, wherein the CS regularization term promotes sparsity of the spatially resolved FODs.

5. The method of claim 4, wherein the sparsity is promoted by minimization of a 1-norm associated with the spatially resolved FODs.

6. The method of claim 2, wherein the CS regularization term promotes smoothness of the spatially resolved FODs.

7. The method of claim 6, wherein the smoothness is promoted by the minimization of a total variation (TV) of the spatially resolved FODs.

8. The method of claim 1, wherein the plurality of the diffusion encodings form an undersampled diffusion spectrum imaging (DSI) data set having a randomly undersampled Cartesian grid in diffusion encoding space, and wherein performing generalized spherical deconvolution to reconstruct the spatially resolved FODs comprises reconstructing an ensemble average propagator (EAP) using compressed sensing, transforming the reconstructed EAP back to a fully sampled DSI data set, and performing spherical deconvolution on the fully sampled DSI data set.

9. The method of claim 1, wherein performing generalized spherical deconvolution comprises extending the modeled TRM by modeling multiple diffusivities for anisotropic components, isotropic components, or both, within each imaging voxel, wherein reconstructing the spatially resolved FODs comprises deconvolving q-space data obtained from the acquired magnetic resonance signals with the extended TRM, transforming the spatially resolved FODs to the diffusion encoding space by multiplication with the extended TRM, and computing quantitative tissue maps based on the output of the multiplication step.

10. A magnetic resonance imaging (MRI) system, comprising:
a primary field magnet configured to place gyromagnetic nuclei within a patient into an equilibrium magnetization;
a plurality of gradient field coils configured to encode positional information into the gyromagnetic nuclei;
a radiofrequency (RF) transmit coil configured to perturb the gyromagnetic nuclei away from their equilibrium magnetization;
a plurality of RF receiving coils configured to receive MR signals from the gyromagnetic nuclei as they relax to their equilibrium magnetization; and
control and analysis circuitry programmed to:
acquire magnetic resonance signals using a plurality of diffusion encodings, each acquired magnetic resonance signal corresponding to one of the diffusion encodings and being representative of a three-dimensional distribution of displacement of magnetic spins of the gyromagnetic nuclei present in each imaging voxel;

perform generalized spherical deconvolution using the acquired magnetic resonance signal and a modeled tissue response matrix (TRM) to reconstruct a spatially resolved fiber orientation distribution (FODs); and generate a representation of fibrous tissue within the patient using the spatially resolved FODs.

11. The system of claim 10, wherein the control and analysis circuitry is configured to add a compressed sensing (CS) regularization term to the least squares formulation, and wherein the CS regularization term incorporates prior knowledge about the patient tissue, and the generalized spherical deconvolution comprises a least squares formulation.

12. The system of claim 11, wherein the control and analysis circuitry is configured to transform the reconstructed FODs into diffusion encoding space by multiplication with the modeled TRM, and compute quantitative tissue maps based on an output of the multiplication step.

13. The system of claim 11, wherein the CS regularization term promotes sparsity of the spatially resolved FODs, and wherein the sparsity is promoted by minimization of a 1-norm associated with the spatially resolved FODs.

14. The system of claim 11, wherein the sparsity is promoted by minimization of a 1-norm associated with the spatially resolved FODs, and wherein the CS regularization term promotes smoothness of the spatially resolved FODs.

15. The system of claim 10, wherein the control and analysis circuitry is configured to randomly undersample Cartesian grid in diffusion encoding space, reconstruct an ensemble average propagator (EAP) using compressed sensing, to transform the reconstructed EAP back to a fully sampled DSI data set, and to perform spherical deconvolution on the fully sampled diffusion spectrum imaging (DSI) data set to reconstruct the spatially resolved FODs, wherein the plurality of the diffusion encodings form an undersampled DSI data set having the randomly undersampled Cartesian grid in diffusion encoding space.

16. The system of claim 10, wherein the control and analysis circuitry is configured to extend the modeled TRM by modeling multiple diffusivities for anisotropic components, isotropic components, or both, within each imaging voxel, to deconvolute q-space data obtained from the acquired magnetic resonance signals with the extended TRM to reconstruct the spatially resolved FODs, to transform the spatially resolved FODs to the diffusion encoding space by multiplication with the extended TRM, and to compute quantitative tissue maps based on the output of the multiplication step.

17. One or more tangible, non-transitory, machine-readable media storing instructions executable by one or more processors to:

cause a magnetic resonance (MR) imaging system to acquire magnetic resonance signals using a plurality of diffusion encodings, each acquired magnetic resonance signal corresponding to one of the diffusion encodings and being representative of a three-dimensional distribution of displacement of magnetic spins of the gyromagnetic nuclei present in each imaging voxel;

perform generalized spherical deconvolution using the acquired magnetic resonance signal and a modeled tissue response matrix (TRM) to reconstruct a spatially resolved fiber orientation distribution (FODs); and generate a representation of fibrous tissue within the patient using the spatially resolved FODs.

18. The media of claim 17, wherein the instructions are configured to add a compressed sensing (CS) regularization term to a least squares formulation, and wherein the CS regularization term incorporates prior knowledge about the patient tissue, and the generalized spherical deconvolution comprises the least squares formulation.

19. The media of claim 17, wherein the instructions are configured to randomly undersample Cartesian grid in diffusion encoding space, to reconstruct an ensemble average propagator (EAP) using compressed sensing, transform the reconstructed EAP back to a fully sampled diffusion spectrum imaging (DSI) data set, and perform spherical deconvolution on the fully sampled DSI data set to reconstruct the spatially resolved FODs, wherein the plurality of the diffusion encodings form an undersampled DSI data set having the randomly undersampled Cartesian grid in diffusion encoding space.

20. The media of claim 17, wherein the instructions are configured to extend the modeled TRM by modeling multiple diffusivities for anisotropic components, isotropic components, or both, within each imaging voxel, to deconvolute q-space data obtained from the acquired magnetic resonance signals with the extended TRM to reconstruct the spatially resolved FODs, to transform the spatially resolved FODs to the diffusion encoding space by multiplication with the extended TRM, and to compute quantitative tissue maps based on the output of the multiplication step.

* * * * *